United States Patent
Komiya

(10) Patent No.: US 11,956,964 B2
(45) Date of Patent: Apr. 9, 2024

(54) SEMICONDUCTOR MEMORY DEVICE AND METHOD OF MANUFACTURING THEREOF

(71) Applicant: Kioxia Corporation, Tokyo (JP)

(72) Inventor: Ken Komiya, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 342 days.

(21) Appl. No.: 17/200,283

(22) Filed: Mar. 12, 2021

(65) Prior Publication Data

US 2021/0296328 A1   Sep. 23, 2021

(30) Foreign Application Priority Data

Mar. 23, 2020 (JP) ................................ 2020-051576

(51) Int. Cl.
| | |
|---|---|
| *H01L 27/115* | (2017.01) |
| *H01L 23/522* | (2006.01) |
| *H10B 43/27* | (2023.01) |
| *H10B 43/35* | (2023.01) |

(52) U.S. Cl.
CPC ......... *H10B 43/35* (2023.02); *H01L 23/5226* (2013.01); *H10B 43/27* (2023.02)

(58) Field of Classification Search
CPC ........ H10B 41/27; H10B 43/35; H10B 41/35; H10B 43/27; H10B 43/10; H10B 43/40; H10B 43/50; H01L 2224/2105; H01L 2224/24146; H01L 2924/1431; H01L 2924/14511; H01L 2224/08145; H01L 2224/32145

See application file for complete search history.

(56) References Cited

U.S. PATENT DOCUMENTS

| | | | |
|---|---|---|---|
| 6,153,920 A |  | 11/2000 | Gossmann et al. |
| 9,324,727 B2 | * | 4/2016 | Lee ........................ H10B 41/20 |
| 9,824,966 B1 | * | 11/2017 | Kanakamedala ... H01L 23/5226 |
| 10,032,789 B2 | * | 7/2018 | Lee ........................ H01L 29/167 |
| 10,403,638 B2 | * | 9/2019 | Lee ........................ H10B 43/27 |
| 11,075,122 B2 | * | 7/2021 | Shioda ............ H01L 21/823475 |
| 2003/0129802 A1 |  | 7/2003 | Lanzerotti et al. |

(Continued)

FOREIGN PATENT DOCUMENTS

| | | |
|---|---|---|
| JP | 2019096880 A | 6/2019 |
| JP | 2019161067 A | 9/2019 |
| JP | 2019201040 A | 11/2019 |

*Primary Examiner* — Mary A Wilczewski
*Assistant Examiner* — Tsz K Chiu
(74) *Attorney, Agent, or Firm* — Holtz, Holtz & Volek PC

(57) ABSTRACT

A semiconductor memory device according to the present embodiment includes a semiconductor substrate, a structure including a plurality of insulating films and a plurality of conductive films alternately stacked on the semiconductor substrate, and a pillar penetrating the structure. The plurality of conductive films include a plurality of first conductive films and a second conductive film arranged closer to the semiconductor substrate than the plurality of first conductive films. The pillar has a first epitaxial growth layer doped with boron and carbon in a part in contact with the semiconductor substrate, and configured to functions as a part of a source side select gate transistor together with the second conductive film. The plurality of first conductive films configured to functions as a part of a plurality of non-volatile memory cells.

6 Claims, 6 Drawing Sheets

(56) References Cited

U.S. PATENT DOCUMENTS

| | | | |
|---|---|---|---|
| 2014/0264548 A1* | 9/2014 | Lee | H10B 43/27 |
| | | | 257/324 |
| 2017/0047343 A1* | 2/2017 | Lee | H10B 43/27 |
| 2017/0110464 A1* | 4/2017 | Rabkin | H01L 29/32 |
| 2017/0186766 A1* | 6/2017 | Kitao | H10B 43/35 |
| 2017/0288038 A1 | 10/2017 | Ishida et al. | |
| 2019/0157294 A1 | 5/2019 | Kanamori et al. | |
| 2019/0287992 A1 | 9/2019 | Sato | |
| 2019/0348434 A1 | 11/2019 | Shioda et al. | |
| 2020/0091172 A1* | 3/2020 | Mori | H01L 29/40117 |
| 2020/0194450 A1* | 6/2020 | Pachamuthu | H01L 21/76877 |
| 2020/0303406 A1* | 9/2020 | Komiya | H01L 29/458 |

\* cited by examiner

SEMICONDUCTOR MEMORY DEVICE AND METHOD OF MANUFACTURING THEREOF

CROSS REFERENCES TO RELATED APPLICATION(S)

This application is based upon and claims the benefit of priority from the prior Japanese Patent Application JP2020-51576, filed on Mar. 23, 2020, the entire contents of which are incorporated herein by reference.

FIELD

Embodiments described herein relate generally to a semiconductor memory device and methods of manufacturing the same.

BACKGROUND

A NAND flash memory is known as a semiconductor memory device. In order to increase the capacity of the NAND flash memory, a three-dimensional NAND flash memory having a configuration that a large number of memory cells are stacked has been put into practical use. In such a stacked three-dimensional NAND flash memory, it is a problem to improve the electric properties.

DETAILED DESCRIPTION

Figure 1:
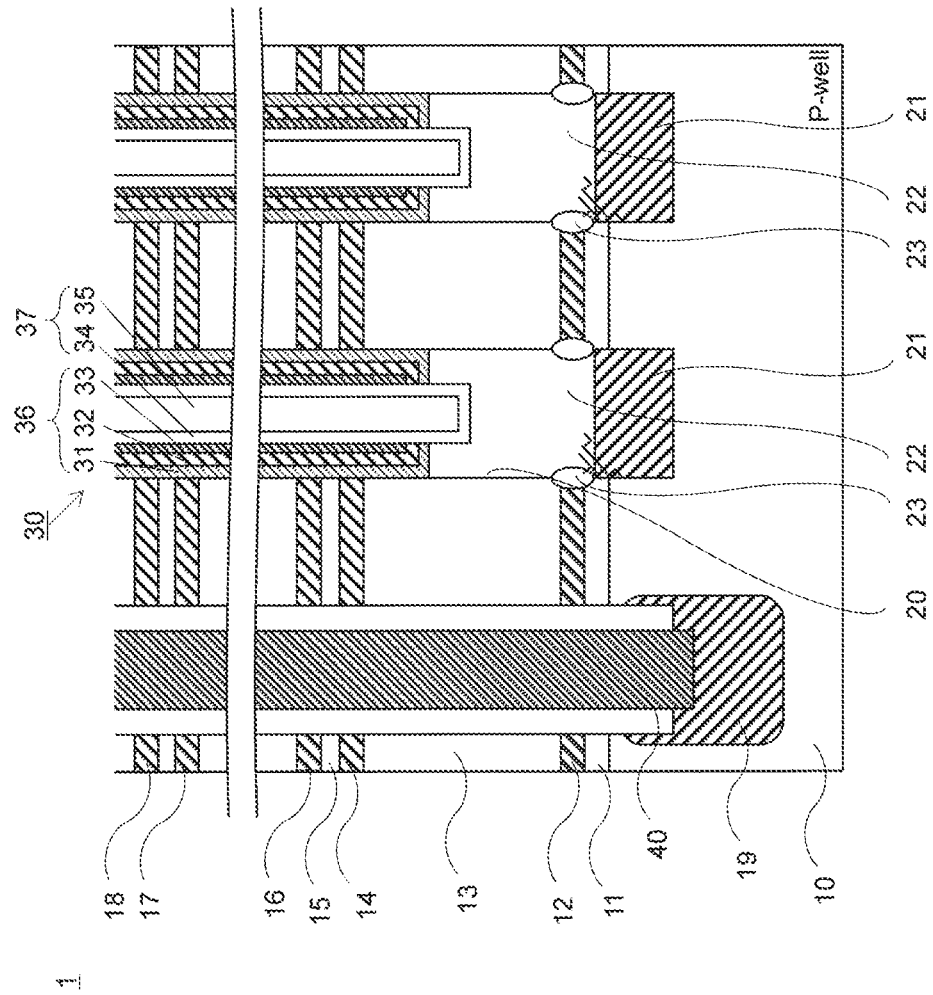
FIG. 1 is a cross-sectional view showing a semiconductor memory device according to an embodiment.

A semiconductor memory device according to the present embodiment includes a semiconductor substrate, a structure including a plurality of insulating films and a plurality of conductive films alternately stacked on the semiconductor substrate, and a pillar penetrating the structure. The plurality of conductive films include a plurality of first conductive films and a second conductive film arranged closer to the semiconductor substrate than the plurality of first conductive films. The pillar has a first epitaxial growth layer doped with boron and carbon in a part in contact with the semiconductor substrate, and configured to functions as a part of a source side select gate transistor together with the second conductive film. The plurality of first conductive films configured to functions as a part of a plurality of non-volatile memory cells.

Hereinafter, a non-volatile semiconductor memory device according to the present embodiment will be described in detail by referring to the drawings. In the following description, components having substantially the same functions and configurations are denoted by the same reference numerals, and redundant description will be given when necessary. Each of the embodiments described below exemplifies a device and a method for embodying the technical idea of this embodiment, and the technical idea of the embodiment does not specify the material, shape, structure, arrangement, and the like of the component parts as follows. Various modifications can be made to the technical idea of the embodiment in the claims.

Drawings may be represented by widths, thickness, shapes, etc. of parts compared to actual embodiments for clarity of description, but they are by way of example only and not limitation of the interpretation of the present invention. In the present specification and in each figure, elements having the same functions as described with respect to the existing figure may be denoted by the same reference numerals, and redundant description may be omitted.

Multiple films formed by the same process have the same layer structure and include the same material. For the purposes of this specification, multiple films formed by the same process are treated as layers, each of which resides on the same layer, even if the layers serve different functions or roles.

[Configuration of Semiconductor Memory Device]

A configuration of a semiconductor memory device according to an embodiment will be described referring to FIG. 1. FIG. 1 is a cross-sectional view showing a semiconductor memory device 1 according to the embodiment.

The semiconductor memory device 1 is a NAND flash memory device and includes memory cells arranged three-dimensionally on a semiconductor substrate 10. Specifically, a source side select gate transistor, a large number, for example, 64 memory cell transistors, and a drain side select gate transistor are connected in series in a direction crossing the semiconductor substrate 10 to constitute a memory string. A dummy cell transistor may be included in both sides of the multiple memory cell transistors connected in series, or between a parts of the multiple memory cell transistors.

As shown in FIG. 1, in the semiconductor substrate 10, a structure in which a plurality of insulating films and a plurality of conductive films arranged on the semiconductor substrate 10 are alternately stacked is arranged. This plurality of conductive films corresponds to a source side select gate line 12, word lines 14, 16, 17, 18, etc. connected to the respective transistors in the memory string. Although only one layer of the source side select gate line 12, four layers of the word lines 14, 16, 17, 18 are shown in FIG. 1, the numbers of the respective conductive film are not particularly limited. In FIG. 1, only a lower side of a stacked structure of a memory cell region is shown, but the stacked structure also extends, for example, to a drawn region. Although not shown in FIG. 1, the drain side select gate line is arranged on the upper layer side of the stacked structure, and a bit line is arranged on the stacked structure. The semiconductor substrate 10 is silicon single crystal substrate in which a p-type well P well formed in an n-type region (the semiconductor substrate 10 may be n-type or n-type region provided in a part of the semiconductor substrate 10) is arranged. The plurality of conductive films includes, for example, the conductor such as tungsten. The plurality of insulating films includes, an insulator such as, for example, silicone and oxide.

A memory pillar 30 (a columnar body) is arranged in a memory hole 20 penetrating the stacked structure. The bottom of the memory pillar 30 reaches the p-type well P well of the semiconductor substrate 10 and is electrically connected thereto. The memory pillar 30 includes a first epitaxial growth layer 21, a second epitaxial growth layer 22, a gate insulating film 36 and a semiconductor pillar 37. As will be described later, the first epitaxial growth layer 21 and the second epitaxial growth layer 22 are formed by epitaxially growing a silicon single crystal on the semiconductor substrate 10 using a silicon single crystal. The first epitaxial growth layer 21 is arranged in contact with the semiconductor substrate 10 at the bottom of the memory pillar 30. The first epitaxial growth layer 21 may be partially or entirely embedded in the semiconductor substrate 10. The second epitaxial growth layer 22 is arranged on the first epitaxial growth layer 21. The gate insulating film 36 and the semiconductor pillar 37 are arranged on the second epitaxial growth layer 22. That is, the second epitaxial growth layer 22 is arranged between the first epitaxial growth layer 21 and the gate insulating film 36 and between the first epitaxial growth layer 21 and the semiconductor pillar 37.

The second epitaxial growth layer 22 is surrounded by the source side select gate line 12 via an insulator 23. The second epitaxial growth layer 22 functions as a part of the source side select gate transistor. That is, the first epitaxial growth layer 21 is arranged closer to the semiconductor substrate 10 than the source side select gate line 12. A boundary between the first epitaxial growth layer 21 and the second epitaxial growth layer 22 is arranged between the source side select gate line 12 and the semiconductor substrate 10.

The first epitaxial growth layer 21 is doped with boron and carbon. A boron density of the first epitaxial growth layer 21 is preferably $1 \times 10^{18}$ cm$^{-3}$ or more and $1 \times 10^{19}$ cm$^{-3}$ or less. By the boron density of the first epitaxial growth layer 21 is within the above range, it is possible to ensure a margin of the source side select gate transistor characteristics. When the boron density of the first epitaxial growth layer 21 is less than $1 \times 10^{18}$ cm$^{-3}$, the conductivity is reduced. When the boron density of the first epitaxial growth layer 21 is more than $1 \times 10^{19}$ cm$^{-3}$, threshold voltage of the source side select gate transistor rises.

The carbon density of the first epitaxial growth layer 21 is preferably $1 \times 10^{17}$ cm$^{-3}$ or more and $1 \times 10^{19}$ cm$^{-3}$ or less. By the carbon density of the first epitaxial growth layer 21 is within the above range, the boron in the first epitaxial growth layer 21 can be suppressed from diffusing in the depletion region (e.g., during the subsequent thermal step), the widening of the distribution width of the threshold voltage (variation in threshold voltage) of the source side select gate transistor can be suppressed. When the carbon density of the first epitaxial growth layer 21 is less than $1 \times 10^{17}$ cm$^{-3}$, the effect of suppressing the diffusion of boron is reduced. When the carbon density of the first epitaxial growth layer 21 is more than $1 \times 10^{19}$ cm$^{-3}$, the supply of a boron hole is hindered.

Figure 5:
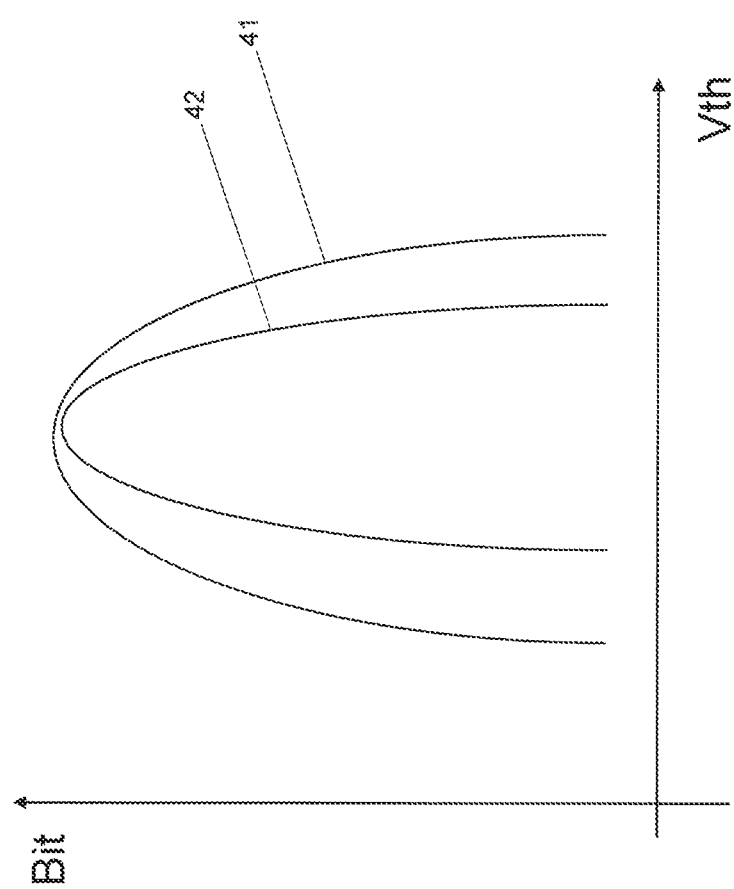
FIG. 5 is a graph showing a distribution of a threshold voltage of a source side select gate transistor of a semiconductor memory device according to embodiments and the comparative example.

FIG. 5 shows the distribution of the threshold voltage of the source side select gate transistor according to the present embodiment and the comparative example. FIG. 5 shows a distribution of the threshold voltage of each source side select gate transistor having the first epitaxial growth layer 21 doped with boron and carbon according to the present embodiment (42), and a distribution of the threshold voltage of each source side select gate transistor having the first epitaxial growth layer doped with born according to the comparative example (carbon is not doped) (41). Comparing 41 and 42, the semiconductor memory device 1 according to the present embodiment has the first epitaxial growth layer 21 doped with boron and carbon, so that the variations in the threshold voltage of each source side select gate transistor is suppressed, and the distribution width of the threshold voltage (42) is suppressed to spread. The semiconductor memory device 1 according to the present embodiment can suppress the widening of the distribution width of the threshold voltage of the source side select gate transistor (variation of the threshold voltage) by having such a configuration, it is possible to suppress a leakage current of the source side select gate transistor.

Boron and carbon in the first epitaxial growth layer 21 are doped while epitaxially growing. The carbon density of the first epitaxial growth layer 21 is preferably lower than the boron density of the first epitaxial growth layer 21.

The second epitaxial growth layer 22 is a so-called non-doped layer (i-type) in which boron and carbon are hardly doped (the boron density and the carbon density are $1 \times 10^{12}$ cm$^{-3}$ or less). Therefore, the carbon density of the second epitaxial growth layer 22 is lower than the carbon density of the first epitaxial growth layer 21. The boron density of the second epitaxial growth layer 22 is lower than the boron density of the first epitaxial growth layer 21.

The gate insulating film 36 in contact with the inner surface of the memory hole 20 and the semiconductor pillar 37 in contact with the inner surface of the gate insulating film 36 are arranged on the second epitaxial growth layer 22 inside the memory hole 20. As the semiconductor pillar 37, amorphous or a polycrystalline silicon film 34 and a silicon dioxide film 35 are stacked from the outer peripheral side to the center side. As the gate insulating film 36, a silicon dioxide film 31, a silicon nitride film 32, and a silicon dioxide film 33 are stacked from the outer peripheral side to the center side. The semiconductor pillar 37 is surrounded by the word lines 14, 16, 17, 18 . . . via the gate insulating film 36 and functions as a part of the non-volatile memory cell that traps a carrier in the silicon nitride film 32.

A high-concentration n-type region 19 is arranged in the p-type well P well of the semiconductor substrate 10. A source line 40 extending in the direction crossing the semiconductor substrate 10 is arranged on the n-type region 19 and is electrically connected to the n-type region 19. The source line 40 is insulated from the plurality of conductive films 12, 14, 16, 17, 18 . . . .

[A Process of Manufacturing Semiconductor Memory Device]

Figure 2:
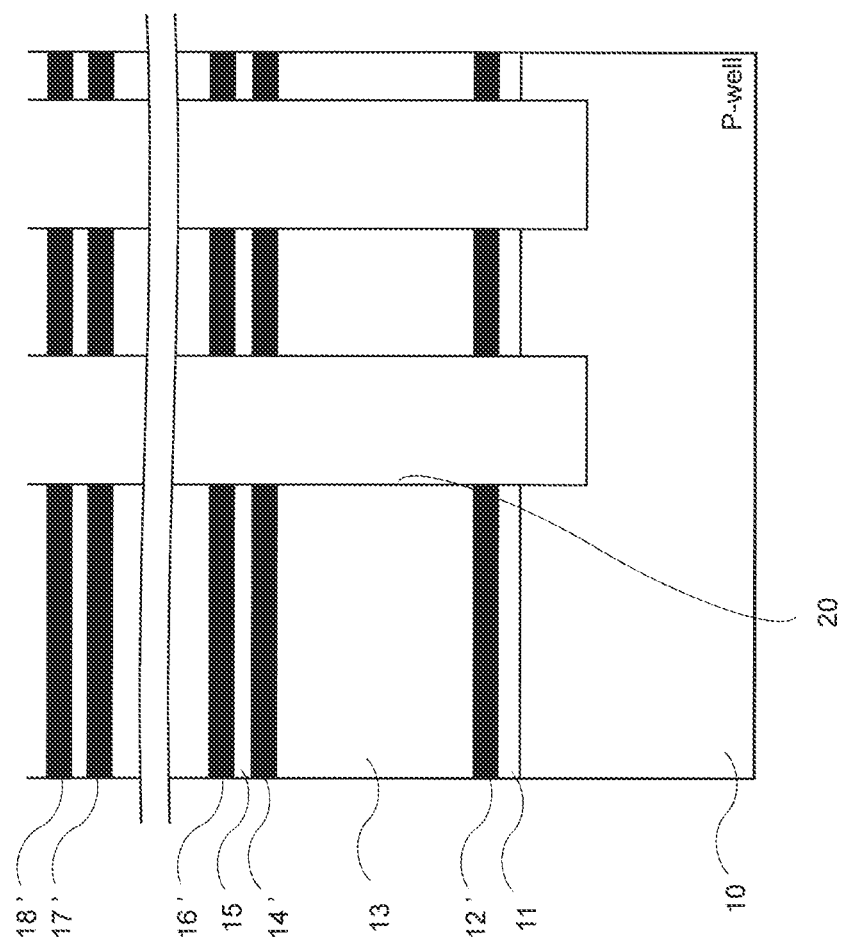
FIG. 2 is a cross-sectional view showing a method of manufacturing a semiconductor memory device according to an embodiment.
Figure 3:
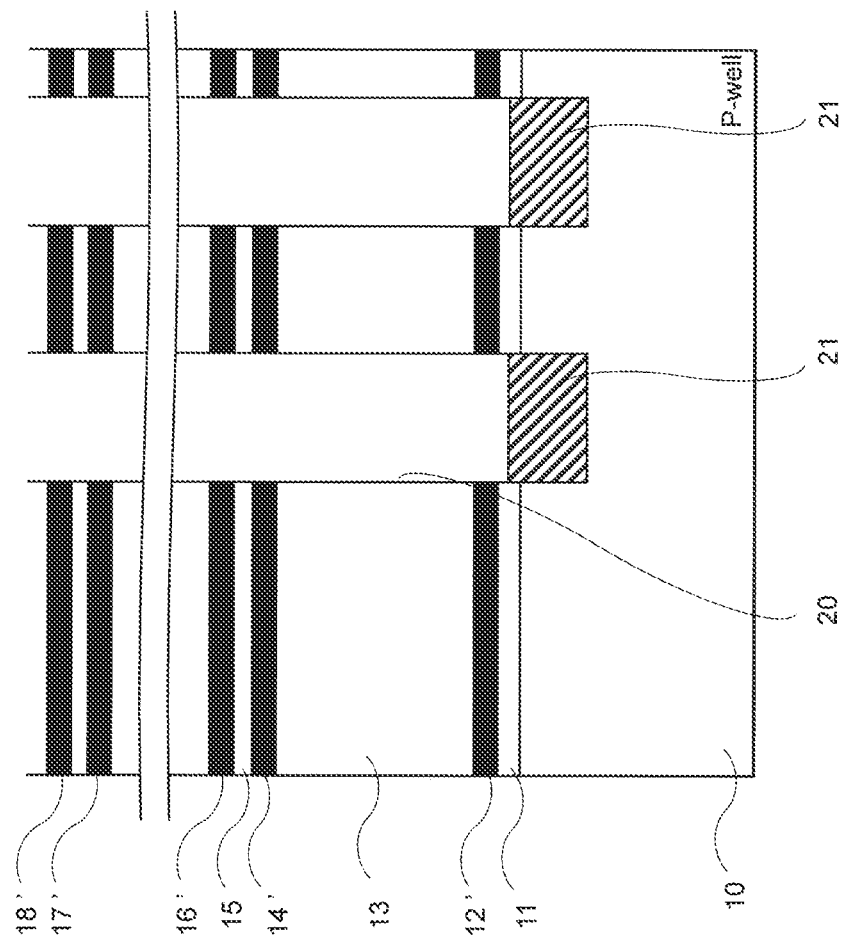
FIG. 3 is a cross-sectional view showing a method of manufacturing a semiconductor memory device according to an embodiment.
Figure 4:
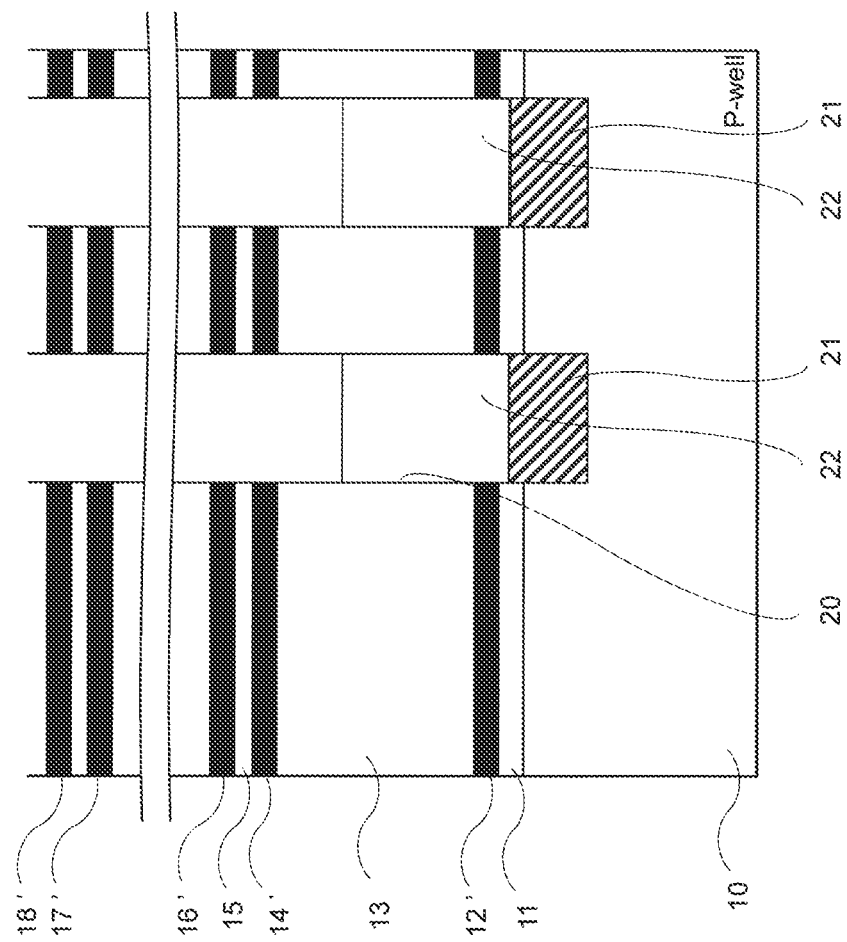
FIG. 4 is a cross-sectional view showing a method of manufacturing a semiconductor memory device according to an embodiment.

FIGS. 2 to 4 are cross-sectional views showing a method of manufacturing a semiconductor memory device according to the embodiment.

As shown in FIG. 2, a stacked structure in which a plurality of SiO$_2$ films (insulating film) 11, 13, 15 . . . , and a plurality of Si$_3$N$_4$ films (dummy film) 12', 14', 16', 17', 18' . . . are alternately stacked is formed on the semiconductor substrate 10 made of silicon single crystal. These SiO$_2$ films (insulating film) and Si$_3$N$_4$ films (dummy film) are stacked using a CVD device.

Subsequently, the stacked structure is selectively dry etched using a mask to form the memory hole 20. The memory hole 20 exposes the semiconductor substrate 10. At this time, a bottom surface of the memory hole 20 may be formed lower than an upper surface of the semiconductor substrate 10. That is, a part of the semiconductor substrate 10 may be etched by etching the stacked structure.

As shown in FIG. 3, epitaxial growth of the silicon single crystal is performed using the semiconductor substrate 10 at the bottom of the memory hole 20 as a seed crystal. The epitaxial growth of the silicon single crystal is also performed using the CVD device to form the first epitaxial growth layer 21. Boron and carbon are doped during the epitaxial growth of the first epitaxial growth layer 21. As the Si raw material gas used for the epitaxial growth, monosilane ($SiH_4$), dichlorosilane ($SiH_2Cl_2$), trichlorosilane ($SiHCl_3$) or the like can be used. As the B raw material gas used for doping of boron, diborane ($B_2H_6$) or the like can be used. As the C raw material gas used for doping carbon, tetrachloromethane ($CCl_4$) or the like can be used. Boron density of the first epitaxial growth layer 21 is formed to be $1\times10^{18}$ $cm^{-3}$ or more and $1\times10^{19}$ $cm^{-3}$ or less. Carbon density of the first epitaxial growth layer 21 is formed to be $1\times10^{17}$ $cm^{-3}$ or more and $1\times10^{19}$ $cm^{-3}$ or less. In the present embodiment, the first epitaxial growth layer 21 is formed from the bottom of the memory hole 20 to below a lowermost layer 12' of a plurality of $Si_3N_4$ film (dummy film).

As shown in FIG. 4, the silicon single crystal is epitaxially grown using the first epitaxial growth layer 21 in the memory hole 20 as a seed crystal. The epitaxial growth of the silicon single crystal is also performed using the CVD device to form the second epitaxial growth layer 22 electrically connected to the first epitaxial growth layer 21. The epitaxial growth of the second epitaxial growth layer 22 is performed so as to be non-doped, that is, so that the boron density of the second epitaxial growth layer 22 is $1\times10^{12}$ $cm^{-3}$ or less and the carbon density of the second epitaxial growth layer 22 is $1\times10^{12}$ $cm^{-3}$ or less. In the present embodiment, the second epitaxial growth layer 22 is formed from the upper surface of the first epitaxial growth layer 21 to below the second layer from the bottom of the plurality of $Si_3N_4$ films (dummy film). That is, the upper surface of the second epitaxical growth layer 22 is formed to be positioned between the lowermost layer 12' and the second layer 14' from the bottom of the plurality of $Si_3N_4$ films (dummy film).

Although not shown in the figure, after forming the second epitaxial growth layer 22, the gate insulating film 36 and the semiconductor pillar 37 electrically connected to the second epitaxial growth layer 22 are respectively formed inside the memory hole 20. As the gate insulating film 36 and the semiconductor pillar 37, the silicon dioxide film 31, the silicon nitride film 32, the silicon dioxide film 33, amorphous or the polycrystalline silicon film 34, the silicon dioxide film 35 are stacked in this order from the outside (inner surface of the memory hole 20).

In addition, a slit (not shown) is mining down, and the $Si_3N_4$ films (dummy film) 12', 14', 16', 17', 18' . . . included in the stacked structure is collectively removed from the slit. Consequently, a void is created in a part where the $Si_3N_4$ films (dummy film) were existed.

The void of the part where the lowermost layer 12' of the $Si_3N_4$ film (dummy film) was existed exposes a side surface of the second epitaxial growth layer 22. The side surface of the second epitaxial growth layer 22 is thermally oxidized from the void side to form the insulator 23. At this time, the void in the part where the other layers 14', 16', 17', 18' . . . of the $Si_3N_4$ film were existed exposes the silicon dioxide film 31 of the gate insulating film 36. Then, by filling a metal such as tungsten in the void, the conductive films 12, 14, 16, 17, 18 . . . described in FIG. 1 are formed.

The semiconductor memory device 1 having the configuration shown in FIG. 1 can be manufactured by a series of steps described above.

[Modified Example of Semiconductor Memory Device]

Figure 6:
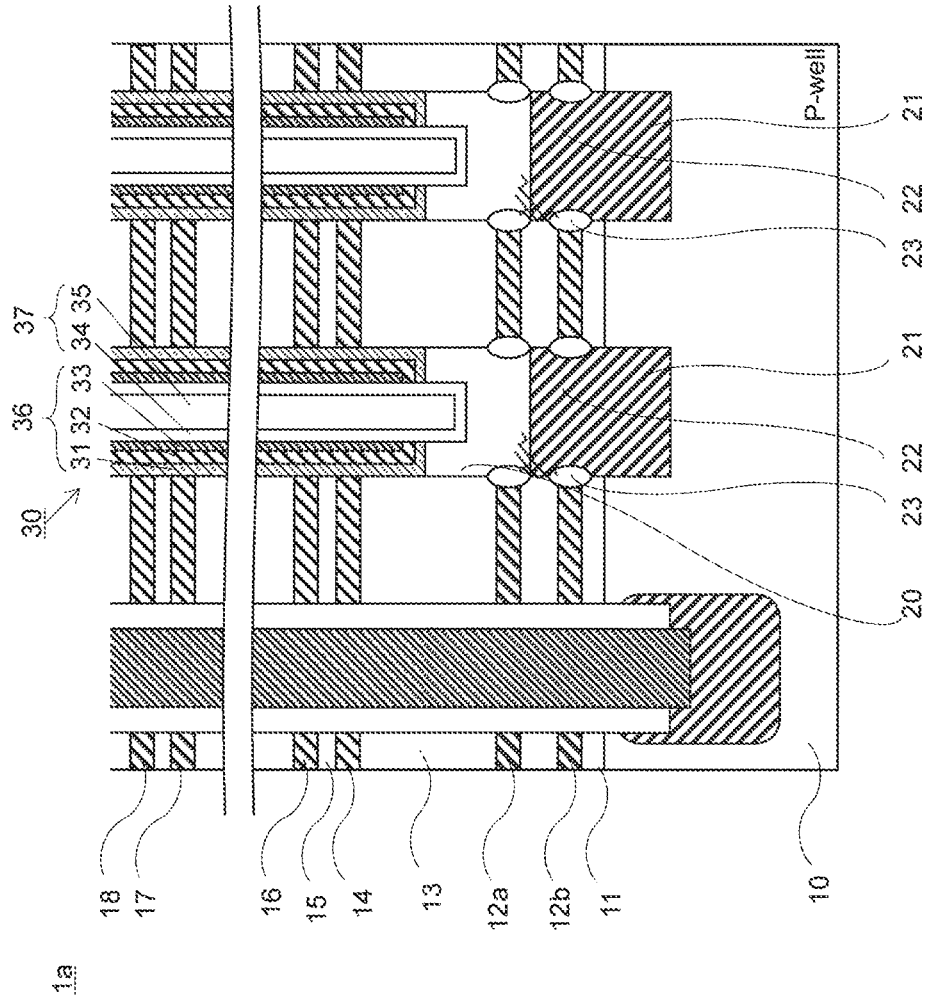
FIG. 6 is a cross-sectional view showing a semiconductor memory device according to a modified example of the present invention.

The configuration of the semiconductor memory device according to a modified example will be described referring to FIG. 6. FIG. 6 is a cross-sectional view showing a semiconductor memory device according to the modified example.

Since a semiconductor memory device 1a according to the present modified example is the same as the semiconductor memory device 1 described above except that it has two layers of source side select gate lines 12a and 12b, descriptions of common parts will be omitted.

The semiconductor memory device 1a according to the present modified example has two layers of the source side select gate lines 12a, 12b. The second epitaxial growth layer 22 is surrounded by the source side select gate line 12a via the insulator 23, functions as a part of the source side select gate transistor. That is, the first epitaxial growth layer 21 is arranged closer to the semiconductor substrate 10 than the source side select gate line 12a. Boundary between the first epitaxial growth layer 21 and the second epitaxial growth layer 22 is arranged between the source side select gate line 12a and the source side select gate line 12b. However, the present invention is not limited thereto, the boundary between the first epitaxial growth layer 21 and the second epitaxial growth layer 22 may be arranged between the source side select gate line 12b and the semiconductor substrate 10.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a semiconductor substrate;
   a structure including a plurality of insulating films and a plurality of conductive films alternately stacked on the semiconductor substrate; and
   a pillar penetrating the structure,
   wherein;
   the plurality of conductive films include a plurality of first conductive films and a second conductive film arranged closer to the semiconductor substrate than the plurality of first conductive films,
   the pillar has a first epitaxial growth layer doped with boron and carbon in a part in contact with the semiconductor substrate, and configured to function as a part of a source side select gate transistor together with the second conductive film,
   the plurality of first conductive films are configured to function as a part of a plurality of non-volatile memory cells,
   the pillar has a second epitaxial growth layer between the plurality of non-volatile memory cells and the first epitaxial growth layer,
   a carbon density of the second epitaxial growth layer is lower than a carbon density of the first epitaxial growth layer, and
   a boron density of the second epitaxial growth layer is lower than a boron density of the first epitaxial growth layer.

2. The semiconductor memory device according to claim 1, wherein the first epitaxial growth layer includes a first region having a carbon density of at least $1\times10^{17}$ $cm^{-3}$ and at most $1\times10^{19}$ cm$^{-3}$ and a boron density of at least $1\times10^{18}$ cm$^{-3}$ and at most $1\times10^{19}$ cm$^{-3}$.

3. The semiconductor memory device according to claim 1, wherein a carbon density of the first epitaxial growth layer is lower than a boron density of the first epitaxial growth layer.

4. The semiconductor memory device according to claim 1, wherein the second epitaxial growth layer includes a second region having a carbon density of at most $1\times10^{12}$ cm$^{-3}$ and a boron density of at most $1\times10^{12}$ cm$^{-3}$.

5. The semiconductor memory device according to claim 1, wherein the first epitaxial growth layer is arranged between the semiconductor substrate and the second conductive film.

6. The semiconductor memory device according to claim 1, wherein:
- the second conductive film includes at least two second conductive films, and
- the first epitaxial growth layer is arranged between the semiconductor substrate and at least one of the second conductive films.

\* \* \* \* \*